(12) United States Patent
Zhu et al.

(10) Patent No.: US 10,211,794 B1
(45) Date of Patent: Feb. 19, 2019

(54) SILICON SHIELDING FOR BASEBAND TERMINATION AND RF PERFORMANCE ENHANCEMENT

(71) Applicant: NXP USA, Inc., Austin, TX (US)

(72) Inventors: Ning Zhu, Chandler, AZ (US); Damon G. Holmes, Scottsdale, AZ (US); Jeffrey Kevin Jones, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/831,127

(22) Filed: Dec. 4, 2017

(51) Int. Cl.
| | |
|---|---|
| H03F 3/187 | (2006.01) |
| H03F 3/193 | (2006.01) |
| H03F 3/195 | (2006.01) |
| H03F 1/56 | (2006.01) |
| H03F 3/213 | (2006.01) |
| H03F 1/02 | (2006.01) |

(52) U.S. Cl.
CPC ......... H03F 3/1935 (2013.01); H03F 1/0205 (2013.01); H03F 1/565 (2013.01); H03F 3/195 (2013.01); H03F 3/213 (2013.01); *H01L 2224/49175* (2013.01); *H03F 2200/451* (2013.01)

(58) Field of Classification Search
CPC ....................................................... H03F 3/187
USPC ..................................... 330/307, 295, 124 R
See application file for complete search history.

(56) References Cited

U.S. PATENT DOCUMENTS

| | | | |
|---|---|---|---|
| 8,299,475 B2* | 10/2012 | Gambino | H01L 27/14632 257/100 |
| 8,709,855 B2* | 4/2014 | Gambino | H01L 23/552 257/E21.456 |
| 9,281,283 B2 | 3/2016 | Viswanathan et al. | |
| 9,438,184 B2 | 9/2016 | Jones et al. | |
| 9,543,356 B2* | 1/2017 | Gambino | H01L 27/14609 |
| 2009/0305499 A1* | 12/2009 | Gambino | H01L 23/552 438/637 |
| 2010/0123213 A1* | 5/2010 | Chen | H01L 23/5223 257/532 |
| 2011/0141639 A1* | 6/2011 | Dijkhuis | H01L 27/0248 361/56 |
| 2012/0161299 A1* | 6/2012 | Gambino | H01L 27/14623 257/659 |
| 2016/0126239 A1* | 5/2016 | Singh | H01L 27/0682 257/532 |
| 2016/0344353 A1 | 11/2016 | Watts et al. | |

* cited by examiner

*Primary Examiner* — Henry Choe

(57) ABSTRACT

An RF amplifier device includes a semiconductor die and an integrated passive device (IPD) on a ground flange. The IPD includes a semiconductor substrate and a metal-insulator-metal (MIM) capacitor coupled to the semiconductor substrate. The MIM capacitor includes a first electrode, a second electrode, and a dielectric between the first electrode and the second electrode. A first RF capacitor is over the semiconductor substrate and a second RF capacitor is over the semiconductor substrate. A metal layer is patterned to form a portion of an elevated metal shielding structure, a first plate of the first RF capacitor and a first plate of the second RF capacitor. The elevated metal shielding structure is over the MIM capacitor. The IPD is electrically coupled to the semiconductor die.

20 Claims, 11 Drawing Sheets

SILICON SHIELDING FOR BASEBAND TERMINATION AND RF PERFORMANCE ENHANCEMENT

TECHNICAL FIELD

Embodiments of the subject matter described herein relate generally to packaged semiconductor devices, and more particularly to packaged radio frequency (RF) amplifiers with shielded integrated passive devices (IPDs).

BACKGROUND

High power, radio frequency (RF) transistor devices are commonly used in RF communication infrastructure amplifiers. These RF transistor devices typically include one or more input leads, one or more output leads, one or more transistors, one or more bias leads, and various bondwires coupling the leads to the transistor(s). In some cases, input and output circuits also may be contained within the same package that contains the device's transistor(s). More specifically, an in-package input circuit (e.g., including an input impedance matching circuit) may be coupled between a device's input lead and a control terminal (e.g., the gate) of a transistor, and an in-package output circuit (e.g., including an output impedance matching circuit) may be coupled between a current conducting terminal (e.g., the drain) of a transistor and a device's output lead.

Instantaneous signal bandwidth (ISBW) is becoming a major requirement for RF communication infrastructure amplifiers, and thus for the high-power RF transistor devices included in such amplifiers. Along with an impedance matching circuit, an RF device's output circuit also may include a baseband decoupling circuit configured to provide an RF ground down to envelope frequencies. Generally, the ISBW of the device is limited by the low frequency resonance (LFR) caused by interaction between the device's bias feeds and components of such a baseband decoupling circuit. In recent years, RF transistor devices have been developed with limited LFRs in the range of about 450 megahertz (MHz) or less, which supports ISBWs in the range of about 150 MHz or less. Although these devices are sufficient for some applications, the desire for wider RF bandwidth amplifiers continues to increase.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
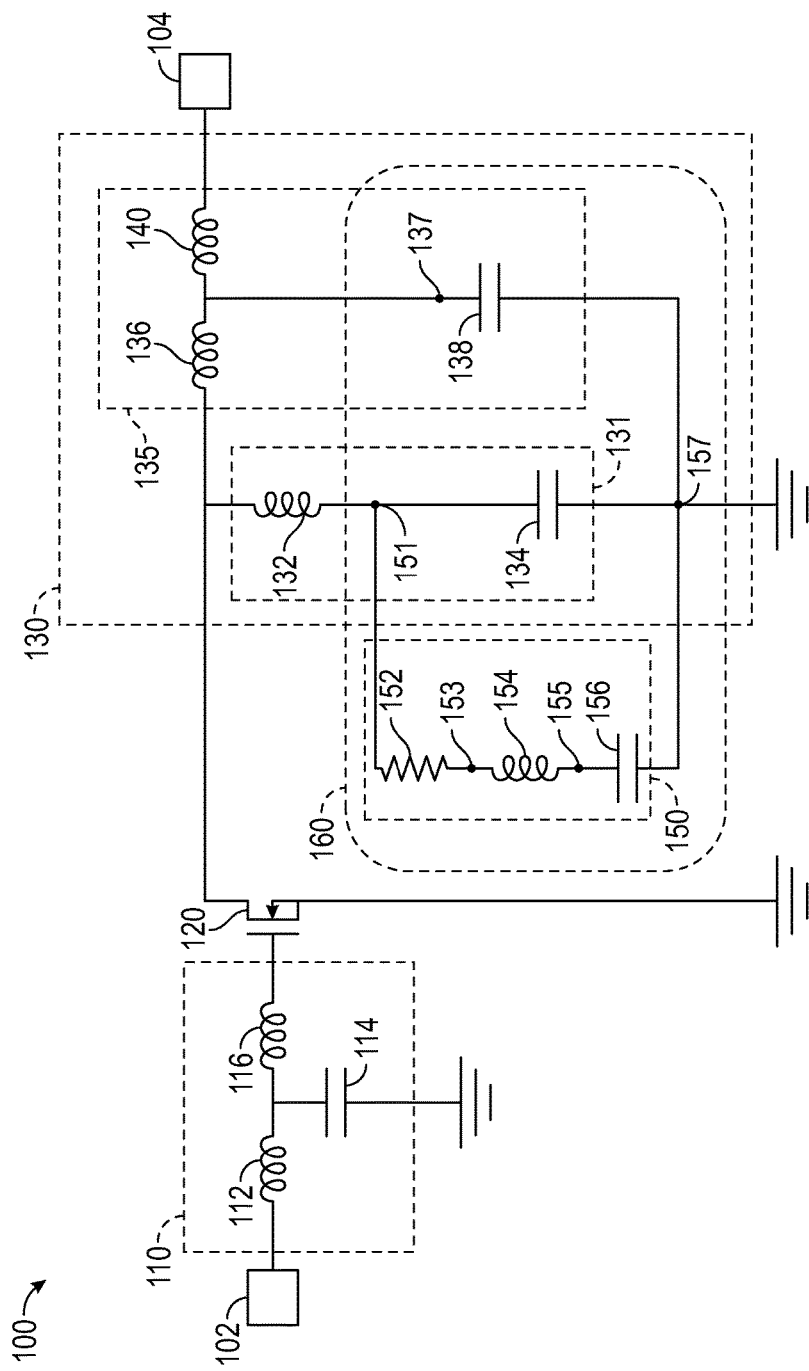
FIG. 1 is a schematic diagram of an RF amplifier with input and output circuits, in accordance with an example embodiment.

A conventional RF amplifier device includes an active device (e.g., a transistor), an input impedance matching circuit coupled between an input to the RF amplifier device and an input to the active device, and an output circuit (including an output impedance matching circuit) coupled between an output of the active device and an output of the RF amplifier device. Embodiments of RF amplifier devices discussed herein may also include a baseband decoupling circuit in the output circuit, which is configured to provide an RF ground down to envelope frequencies. These RF amplifier device embodiments can include output circuit components that may support wider RF bandwidth amplifiers than are achievable using conventional components, while meeting various performance requirements and other criteria. For example, assuming a 3:1 ratio of low frequency resonance (LFR) to instantaneous signal bandwidth (ISBW), embodiments may enable transmission of signals with a 200 megahertz (MHz) or above ISBW, which corresponds to low LFRs of approximately 600 MHz or greater. In other cases, the LFR to ISBW ratio could be from 2.4:1 to 5:1, depending on the system used for linearization (e.g., the digital predistortion (DPD) system).

In various embodiments, a baseband decoupling circuit with a relatively large capacitance value, referred to herein as an envelope capacitance or "$C_{env}$", is used to achieve an increased LFR (and thus increased ISBW). Use of low temperature co-fired ceramic (LTCC) structure to integrate baseband decoupling can improve ISBW and help to achieve target LFRs of 1 gigahertz (GHz) and higher. However, in certain applications, the LTCC material used for low frequency decoupling can have losses in carrier frequencies and reduce performance. RF shielding in LTCC devices can help enhance performance by reducing eddy currents and controlling the current return path of the RF signals in the packaged transistor, but LTCC shielding may face cost and manufacturing issues in certain devices. As such, RF shielding approaches may be desired for shielding integrated passive devices (IPDs) fabricated using semiconductor-based structures.

In a conventional high-power RF transistor device, the transistor and components of the output circuit are mounted on a conductive substrate or flange, and forward current between the transistor and the output lead is carried through bondwires between the transistor and the output lead. Reverse current, on the other hand, is carried in an opposite direction across the surface of the conductive substrate. In this configuration, eddy currents develop during operation in the space between the forward-current-carrying bondwires and the reverse-current-carrying substrate surface. In devices in which these eddy currents pass though low-Q material (e.g., material with high loss tangent) positioned between the forward and reverse current paths, the devices may experience significant power loss through the low-Q material at the carrier frequencies.

To overcome this issue, embodiments of the inventive subject matter include a current path structure that circumscribes the low-Q material (e.g., dielectric materials included in $C_{env}$), thus substantially reducing or eliminating power losses through that low-Q material. In other words, the current path structure substantially eliminates the presence of relatively lossy low-Q material between the device's forward and return current paths. More specifically, in one embodiment, a "reverse current path structure" is configured to carry reverse current, and it is physically positioned between $C_{env}$ and the forward current path.

FIG. 1 is a schematic diagram of an RF amplifier device 100. Device 100 includes an input lead 102, an input impedance matching circuit 110, a transistor 120, an output impedance matching circuit 130, an envelope frequency termination circuit 150, and an output lead 104, in an embodiment. The output impedance matching circuit 130 and the envelope frequency termination circuit 150 may be referred to collectively as an "output circuit." Although transistor 120 and various elements of the input and output impedance matching circuits 110, 130 and the envelope frequency termination circuit 150 are shown as singular components, the depiction is for the purpose of ease of explanation only. Those of skill in the art would understand, based on the description herein, that transistor 120 and/or certain elements of the input and output impedance matching circuits 110, 130 and the envelope frequency termination circuit 150 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 130 and the envelope frequency termination circuit 150, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120, which is also located within the device's interior, and output impedance matching circuit 130 and envelope frequency termination circuit 150 are electrically coupled between a second terminal of transistor 120 and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)) or a high electron mobility transistor (HEMT), each of which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 130 and the envelope frequency termination circuit 150, and the source of transistor 120 is coupled to ground (or another voltage reference). Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This can be advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 102 and the control terminal (e.g., gate) of the transistor 120. According to an embodiment, input impedance matching circuit 110 is a low pass circuit, which includes two inductive elements 112, 116 (e.g., two sets of bondwires) and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 120. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 2 picofarads (pF) to about 100 pF.

Output impedance matching circuit 130 is configured to match the output impedance of device 100 with the input impedance of an external circuit or component (not shown) that may be coupled to output lead 104. Output impedance matching circuit 130 is coupled between the first current conducting terminal (e.g., drain) of transistor 120 and the output lead 104. According to an embodiment, output impedance matching circuit 130 includes three inductive elements 132, 136, 140 (e.g., three sets of bondwires) and two capacitors 134, 138. Output impedance matching circuit 130 includes a high-pass matching circuit 131 (including inductive element 132 and capacitor 134) and a low-pass matching circuit 135 (including inductive elements 136, 140 and capacitor 138), in an embodiment.

In the low-pass matching circuit 135, inductive elements 136, 140 (e.g., third and fourth sets of bondwires), also referred to herein as "$L_{LP1}$" and "$L_{LP2}$", are coupled in series between the first current conducting terminal (e.g., drain) of transistor 120 and the output lead 104, with node 137 between inductive elements 136, 140. Capacitor 138, also referred to herein as "$C_{LP}$", has a first terminal coupled to node 137, and a second terminal coupled to a ground node 157, which in turn may be coupled to ground (or to another voltage reference). The combination of inductive elements 136, 140 and capacitor 138 functions as a first (low-pass) matching stage. According to an embodiment, the series combination of inductive elements 136, 140 may have a value in a range between about 40 pH to about 3 nH, and capacitor 138 may have a value in a range between about 2 pF to about 80 pF, although these components may have values outside of these ranges, as well.

In the high-pass matching circuit 131, inductive element 132 (e.g., a fifth set of bondwires), also referred to as "$L_{shunt}$", is coupled between the first current conducting terminal of transistor 120 and a first terminal of capacitor 134, also referred to as "$C_{shunt}$". A second terminal of capacitor 134 is coupled to a ground node 157. The combination of inductive element 132 and capacitor 134 functions as a second (high-pass) matching stage. According to an embodiment inductive element 132 may have a value in a range between about 80 pH to about 3 nH, and capacitor 134 may have a value in a range between about 50 pF to about 500 pF, although these components may have values outside of these ranges, as well.

An RF "cold point" is present at the node 151 between inductive element 132 and capacitor 134, where the RF cold point represents a high impedance point in the circuit to signals having RF frequencies. Envelope frequency termination circuit 150 is coupled between the RF cold point (at node 151) and ground node 157, in an embodiment. Envelope frequency termination circuit 150 functions to improve the low frequency resonance of device 100 caused by the interaction between the output impedance matching circuit 130 and the bias feeds by presenting a high impedance at RF frequencies. Envelope frequency termination circuit 150 essentially is "invisible" from a matching standpoint, as it only effects the output impedance at envelope frequencies (i.e., envelope frequency termination circuit 150 provides terminations for the envelope frequencies of device 100).

Figure 7:
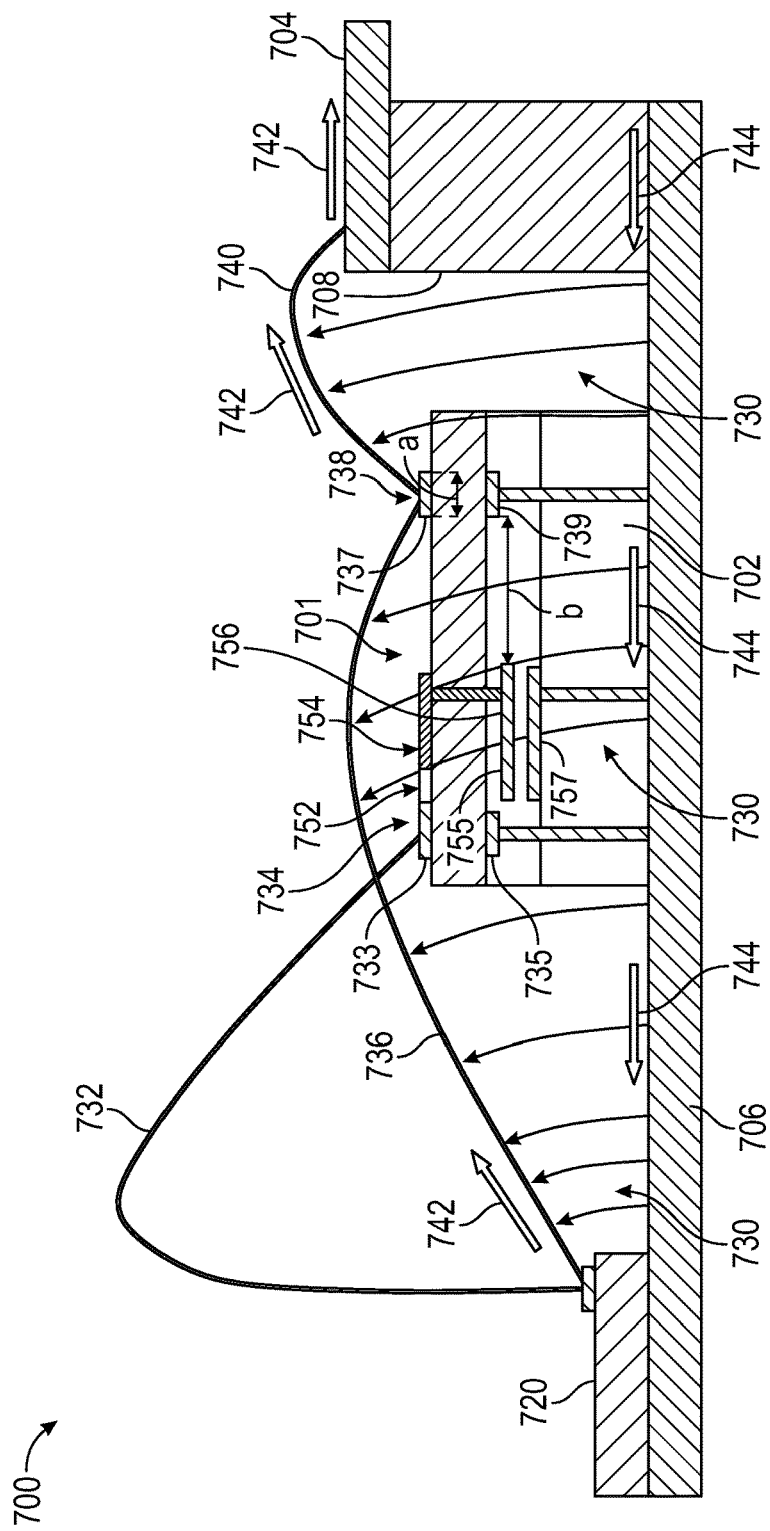
FIG. 7 is a cross-sectional, simplified side view of an RF amplifier device with an unshielded integrated passive device (IPD) that includes a high-density capacitor, showing forward and reverse current paths.

According to an embodiment, envelope frequency termination circuit 150 includes a resistor 152, an inductance 154, and a capacitor 156 coupled in series. A first terminal of resistor 152, referred to herein as an "envelope resistor" or "$R_{env}$," is coupled to node 151 (i.e., the RF cold point). At node 153, a second terminal of envelope resistor 152 is coupled to a first terminal of inductance 154, referred to herein as an "envelope inductor" or "$L_{env}$." At node 155, a second terminal of inductance 154 is coupled to capacitor 156, referred to herein as an "envelope capacitor" or "$C_{env}$." A second terminal of the envelope capacitor 156 is coupled to the ground node 157, in an embodiment. Envelope resistor 152 may have a value in a range between about 0.1 Ohm to about 2 Ohm, envelope inductance 154 may have a value that is less than about 25-500 pH, and envelope capacitor 156 may have a value in a range between about 5 nanofarads (nF) to about 1 microfarad (μF), although these components may have values outside of these ranges, as well. Although envelope inductance 154 is shown to include a single lumped element in FIG. 1, envelope inductance 154 actually may be made up of one or more distinct inductors (e.g., inductor 754, 854, 1054, FIGS. 7, 8, 10) and additional small inductances associated with other conductive features (e.g., conductive vias and portions of conductive traces) present in the conductive path between RF cold point node 151 and ground node 157.

Figure 2:
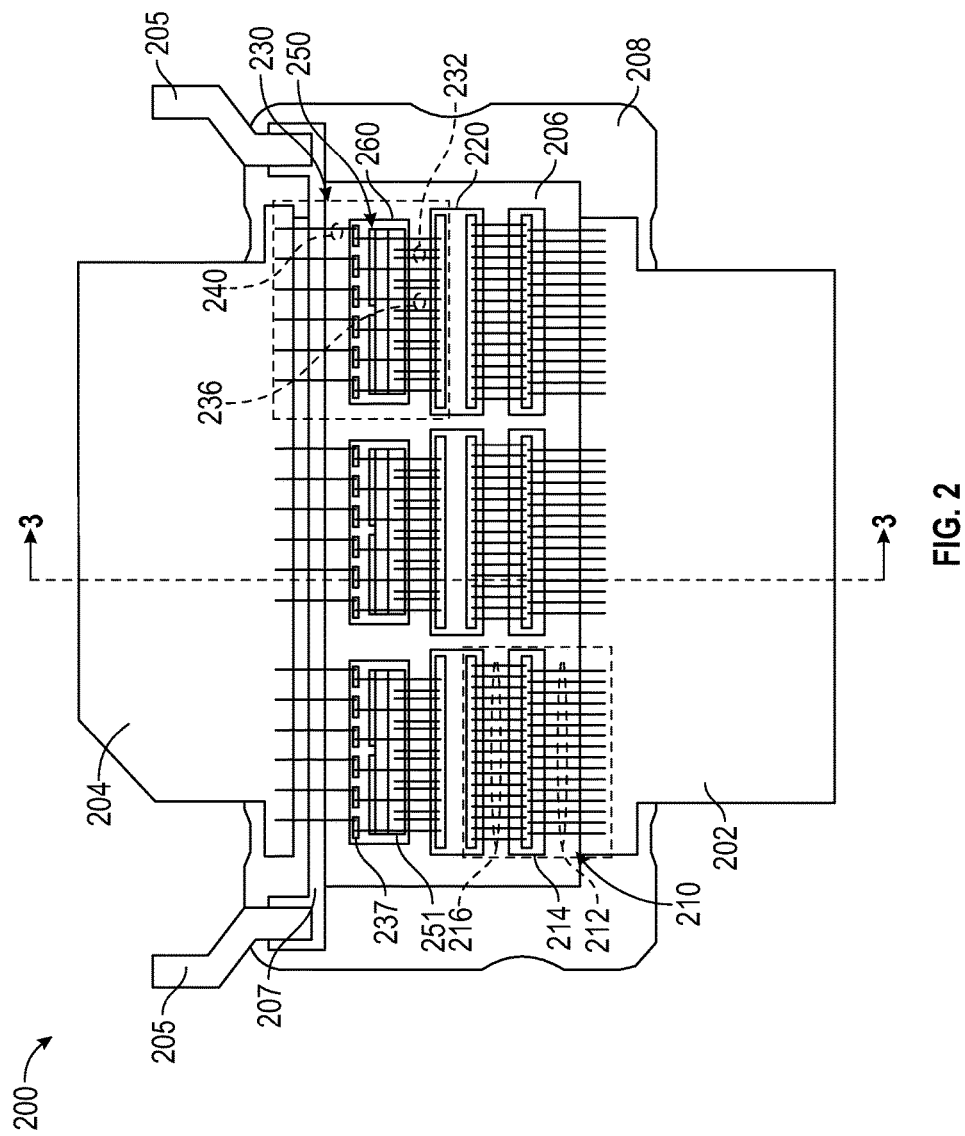
FIG. 2 is a top view of an example of a packaged RF amplifier device that embodies the circuit of FIG. 1, in accordance with an example embodiment.

FIG. 2 is a top view of an example of a packaged RF amplifier device 200 that embodies the circuit of FIG. 1, in accordance with an example embodiment. More particularly, the interconnected electrical components and elements of device 200 may be modeled by the schematic diagram of FIG. 1. For enhanced understanding, FIG. 2 should be viewed in parallel with FIG. 3, which is a cross-sectional, side view of the RF amplifier device 200 of FIG. 2 along line 3-3.

Device 200 includes an input lead 202 (e.g., input lead 102, FIG. 1), an output lead 204 (e.g., output lead 104, FIG. 1), bias leads 205, a flange 206, an isolation structure 208, and three parallel amplification paths (i.e., three parallel instantiations of circuit 100, FIG. 1) electrically coupled between the input and output leads 202, 204. Each amplification path includes an input impedance matching circuit 210 (e.g., input impedance matching circuit 110, FIG. 1), a transistor 220 (e.g., transistor 120, FIG. 1), an output impedance matching circuit 230 (e.g., output impedance matching circuit 130, FIG. 1), and an envelope frequency termination circuit 250 (e.g., envelope frequency termination circuit 150, FIG. 1).

Flange 206 includes a rigid electrically-conductive substrate, which has a thickness that is sufficient to provide structural support for other components and elements of device 200. In addition, flange 206 may function as a heat sink for transistors 220 and other devices mounted on flange 206. Flange 206 has a top and bottom surface and a substantially-rectangular perimeter that corresponds to the perimeter of the device 200. In FIG. 2, only a central portion of the top surface of flange 206 is visible through an opening in isolation structure 208. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. When device 200 is incorporated into a larger electrical system, flange 206 may be used to provide a ground reference for the device 200.

Isolation structure 208 has a frame shape, in an embodiment, which includes a substantially enclosed, four-sided structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. For example, in an alternate embodiment, isolation structure 208 may include multiple portions that contact each other or that are spatially separated from each other (e.g., isolation structure 208 may have one portion isolating input lead 202 from flange 206, and another portion isolating output lead 204 from flange 206). In addition, isolation structure 208 may be formed from a homogenous material, or isolation structure 208 may be formed from multiple layers.

The input and output leads 202, 204 and the bias leads 205 are mounted on a top surface of the isolation structure 208 on opposed sides of the central opening, and thus the input and output leads 202, 204 and the bias leads 205 are elevated above the top surface of the flange 206, and are electrically isolated from the flange 206. For example, the leads 202, 204, 205 may be soldered or otherwise attached to metallization (not shown) on a top surface of isolation structure 208 (e.g., a metallurgic connection). Generally, the leads 202, 204, 205 are oriented to allow for attachment of bondwires (e.g., bondwires 212, 240) between the leads 202, 204, 205 and components and elements within the central opening of isolation structure 208.

According to an embodiment, bias leads 205 are electrically coupled together with a bar-shaped conductor 207, which also is coupled to the top surface of isolation structure 208. According to a particular embodiment, conductor 207 includes metallization on a top surface of isolation structure 208. Proximal ends of bias leads 205 are coupled to opposite ends of conductor 207, in an embodiment. Bondwires (not shown) are electrically coupled between conductor 207 and a bias point (e.g., cold point node 151, 251, FIGS. 1, 2).

Bias leads 205 extend from the device 200, once packaged, so that their distal ends are exposed and may be coupled to a printed circuit board (PCB) of a larger system to receive a bias voltage. Accordingly, inclusion of bias leads 205 eliminates the need for bias leads on the PCB itself. According to an embodiment, each bias lead 205 has a length corresponding to lambda/4, although each bias lead 205 may have a different length, as well. An advantage of including bias leads 205 as part of device 200 is that the bias leads 205 remove the need for quarter wave bias feeds, as additional large value de-coupling capacitors may be connected between the bias leads 205 and ground as the bias leads 205 exit the device package.

Another embodiment may include a four-lead device with an input lead, an output lead, and two bias leads coupled to the input impedance matching circuit. Yet another embodiment includes a six-lead device with an input lead, an output lead, two bias leads coupled to the output impedance matching circuit and two bias leads coupled to the input impedance matching circuit. In still other embodiments, only a single bias lead may be coupled to the input and/or output impedance matching circuits (e.g., particularly for embodiments in which there are more than two RF leads, such as in dual-path and multi-path devices).

Transistors 220 and various elements 214, 260 of the input and output impedance matching circuits 210, 230 and the envelope frequency termination circuit 250 are mounted on a generally central portion of the top surface of a flange 206 that is exposed through the opening in isolation structure 208. For example, the transistors 220 and elements 214, 260 of the input and output impedance matching circuits 210, 230 and the envelope frequency termination circuit 250 may be coupled to flange 206 using conductive epoxy, solder, solder bumps, sintering, and/or eutectic bonds. As used herein, an "active device area" corresponds to a portion of a device on which one or more active devices (e.g., transistor 220) are mounted (e.g., the portion of the conductive surface of flange 206 that exposed through the opening in isolation structure 208).

Each of transistors 220 has a control terminal (e.g., a gate) and two current conducting terminals (e.g., a drain and a source). The control terminal of each transistor 220 is coupled to the input lead 202 through an input impedance matching circuit 210 (e.g., input impedance matching circuit 110, FIG. 1). In addition, one current conducting terminal (e.g., the drain) of each transistor 220 is coupled to the output lead 204 through an output impedance matching circuit 230 (e.g., output impedance matching circuit 130, FIG. 1), and the other current conducting terminal (e.g., the source) is coupled to the flange 206 (e.g., to a ground reference node for the device 200).

In the device 200 of FIG. 2, each input impedance matching circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced sets of bondwires. For example, a first inductive element 212 (e.g., inductive element 112, FIG. 1) includes a plurality of bondwires coupled between input lead 202 and a first terminal of capacitor 214 (e.g., capacitor 114, FIG. 1), and a second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor (e.g., comprised of a silicon substrate with a top surface corresponding to a first terminal, and a bottom surface corresponding to a second terminal). Bondwires 212, 216 are attached to a conductive top plate at the top surface of capacitor 214.

In the device 200 of FIG. 2, each output impedance matching circuit 230 includes three inductive elements 232, 236, 240 (e.g., Lshunt 132, LLP1 136, and LLP2 140, FIG. 1) and two capacitors (e.g., Cshunt 134 and CLP 138, FIG. 1), where the capacitors form portions of device 260 (e.g., device 160, FIG. 1), in an embodiment. Again, each inductive element 232, 236, 240 is formed from a plurality of parallel, closely-spaced sets of bondwires. For example, shunt inductive element 232 (e.g., Lshunt 132, FIG. 1) includes a plurality of bondwires coupled between the first current conducting terminal (e.g., the drain) of transistor 220 and a first bond pad 251 (e.g., corresponding to RF cold point node 151, FIG. 1) on a top surface of device 260. The first bond pad 251 is electrically coupled to a shunt capacitor (e.g., Cshunt 134, FIG. 1) within the device 260. A first series inductive element 236 (e.g., LLP1 136, FIG. 1) includes a plurality of bondwires coupled between the first current conducting terminal of transistor 220 and a second bond pad 237 (e.g., corresponding to node 137, FIG. 1) on the top surface of the device 260. The second bond pad 237 is electrically coupled to a low pass matching capacitor (e.g., CLP 138, FIG. 1) within the device 260. Finally, a second series inductive element 240 (e.g., LLP2 140, FIG. 1) is coupled between the second bond pad 237 and the output lead 204. Second terminals of the shunt and LP-match capacitors within the device 260 are coupled to the flange 206 (e.g., to ground).

According to an embodiment, device 200 is incorporated in an air cavity package, in which transistors 220 and various impedance matching and envelope frequency termination elements are located within an enclosed air cavity 312. Basically, the air cavity is bounded by flange 206, isolation structure 208, and a cap 310 overlying and in contact with the isolation structure 208 and leads 202, 204. In other embodiments, a device may be incorporated into an overmolded package (i.e., a package in which the electrical components within the active device area are encapsulated with a non-conductive molding compound, and in which portions of the leads 202, 204 also may be encompassed by the molding compound).

Figure 3:
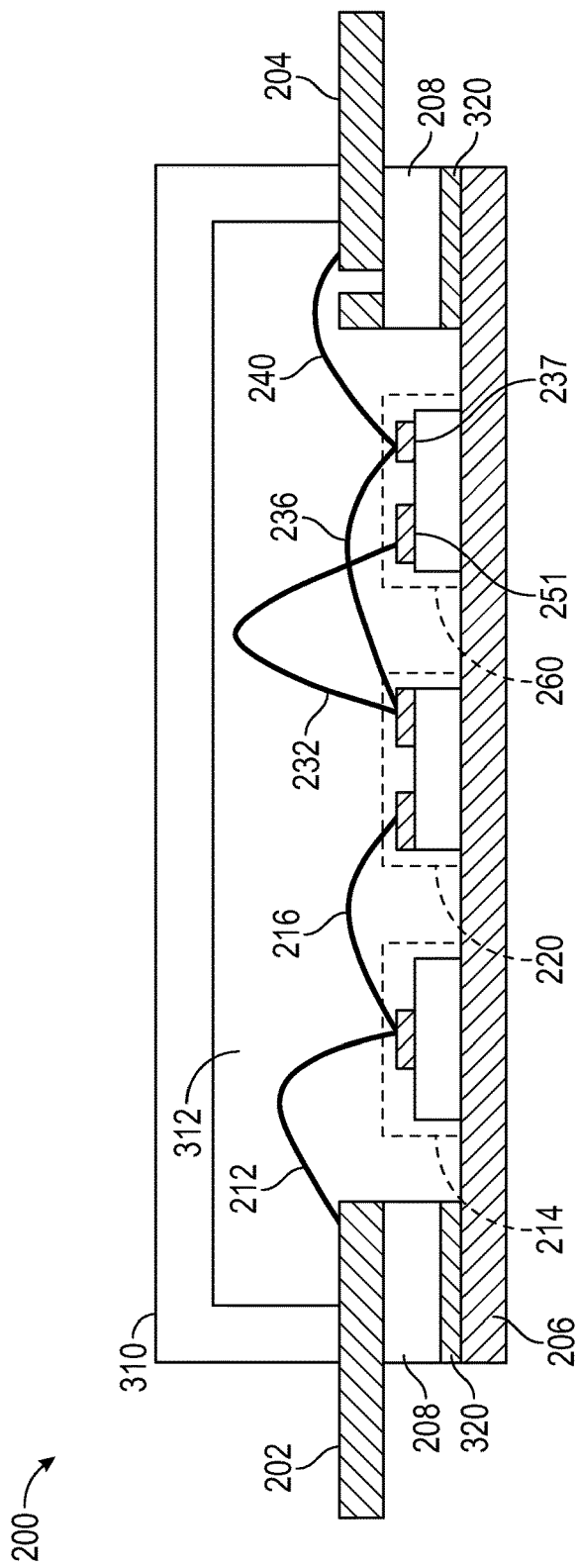
FIG. 3 is a cross-sectional, side view of the RF amplifier device of FIG. 2 along line 3-3.
Figure 4:
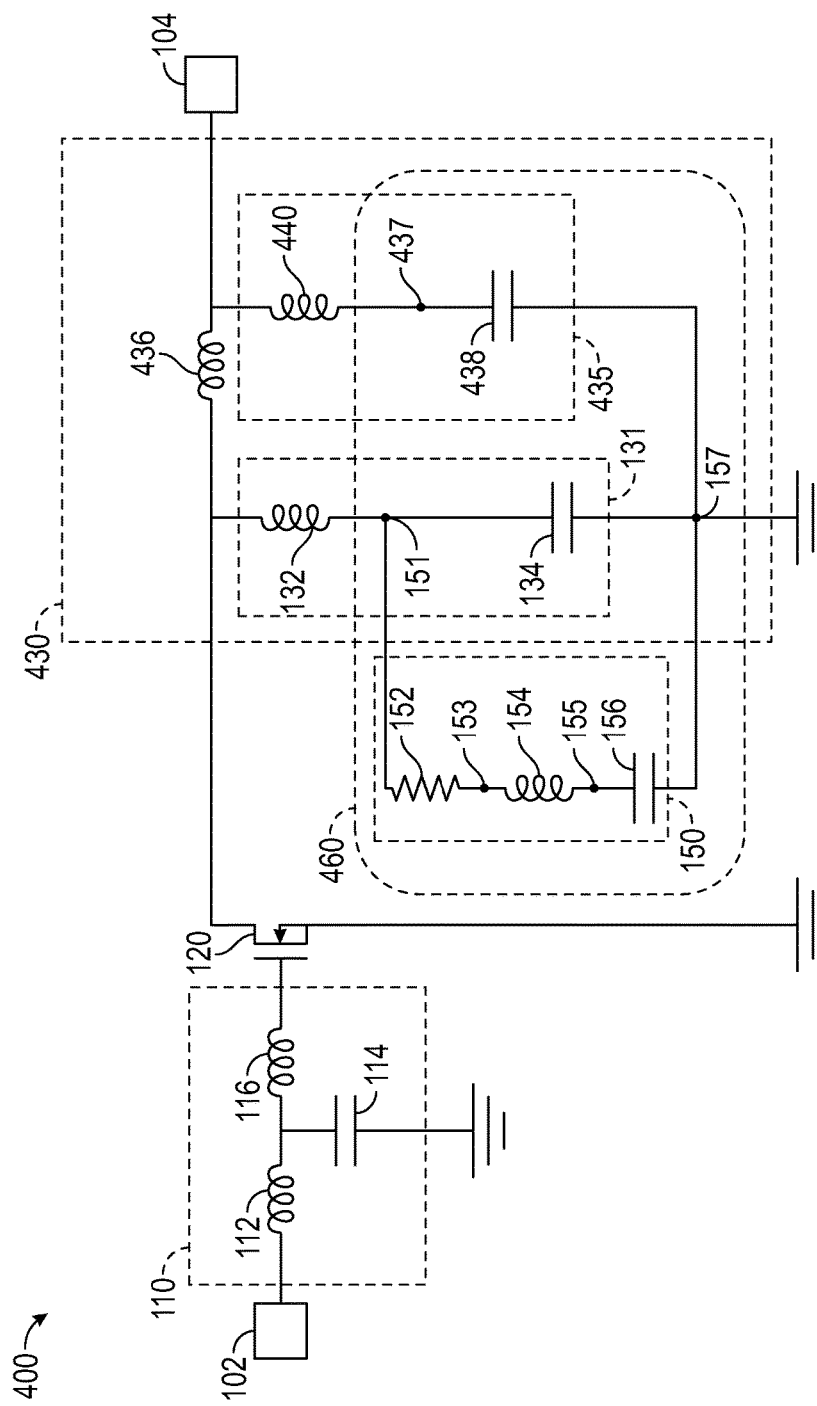
FIG. 4 is a schematic diagram of an RF amplifier with input and output circuits, in accordance with another example embodiment.

In the embodiments discussed in conjunction with FIGS. 1-3, the output impedance matching circuit 130, 230 includes a high-pass shunt circuit 131 and a low-pass, LP-match circuit 135 (e.g., including inductive elements 136, 140 or bondwires 236, 240 and capacitor 138). In an alternate embodiment, the low-pass matching circuit 135 may be replaced with a differently-configured matching circuit. For example, FIG. 4 is a schematic diagram of an RF amplifier 400 with a second matching circuit 435 (e.g., a low-pass matching circuit with a very high frequency resonance) forming a portion of its output impedance matching circuit 430, in accordance with another example embodiment. Except for the replacement of low-pass matching circuit 135 with matching circuit 435, and the inclusion of inductive element 436, RF amplifier 400 may be substantially similar to the amplifier 100 of FIG. 1, and like reference numbers are used in both drawings to indicate elements that may be substantially the same between the two embodiments.

In device 400, inductive element 436, or "$L_{series}$", is coupled directly between the first current conducting terminal (e.g., drain) of transistor 120 and the output lead 104. In addition, the high-pass matching circuit 435, which includes a "bond back" or "BB" inductive element 440 coupled in series with a BB capacitor 438, is coupled between the output lead 104 and the ground node 157. More specifically, $L_{BB}$ 440 is coupled between the output lead 104 and a node 437, and $C_{BB}$ 438 is coupled between node 437 and the ground node 157. According to an embodiment, $L_{series}$ 436 may have a value in a range between about 50 pH to about 3 nH, $L_{BB}$ 440 may have a value in a range between about 50 pH to about 500 pH, and $C_{BB}$ 438 may have a value in a range between about 2 pF to about 50 pF, although these components may have values outside of these ranges, as well.

Figure 5:
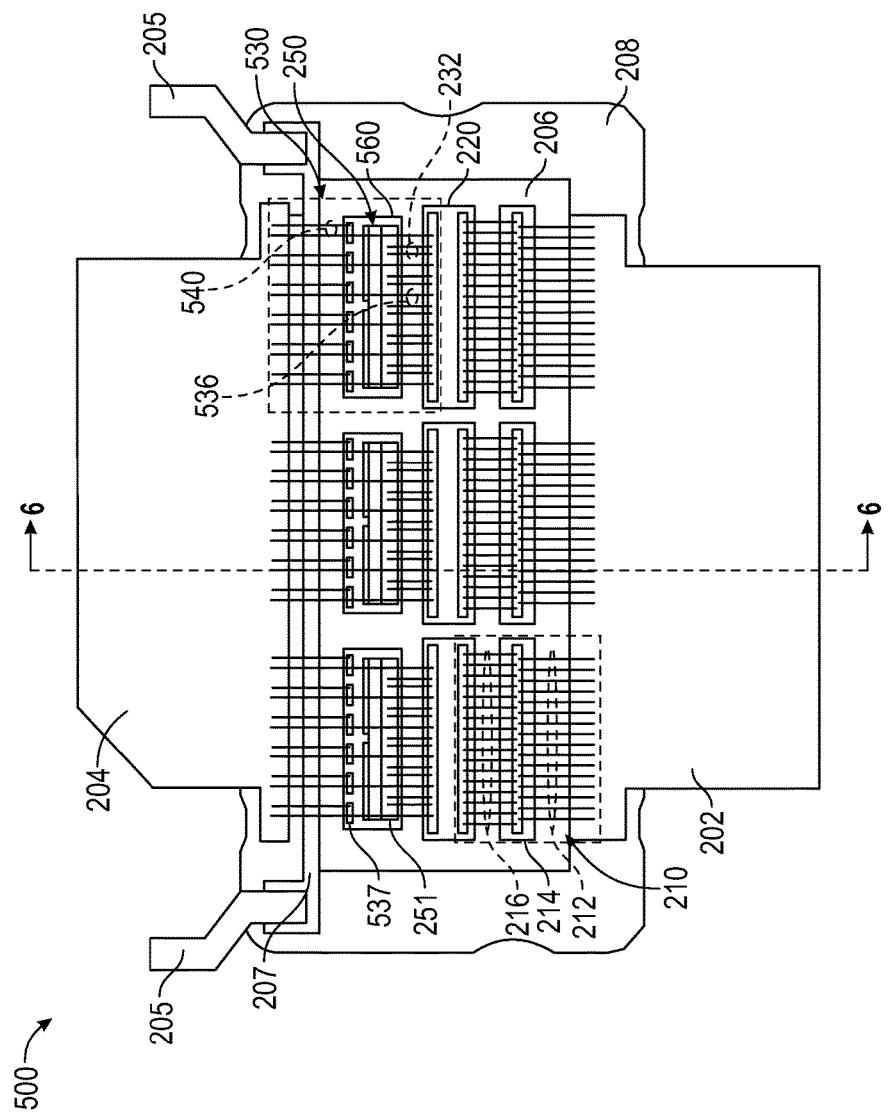
FIG. 5 is a top view of an example of a packaged RF amplifier device that embodies the circuit of FIG. 4, in accordance with an example embodiment.
Figure 6:
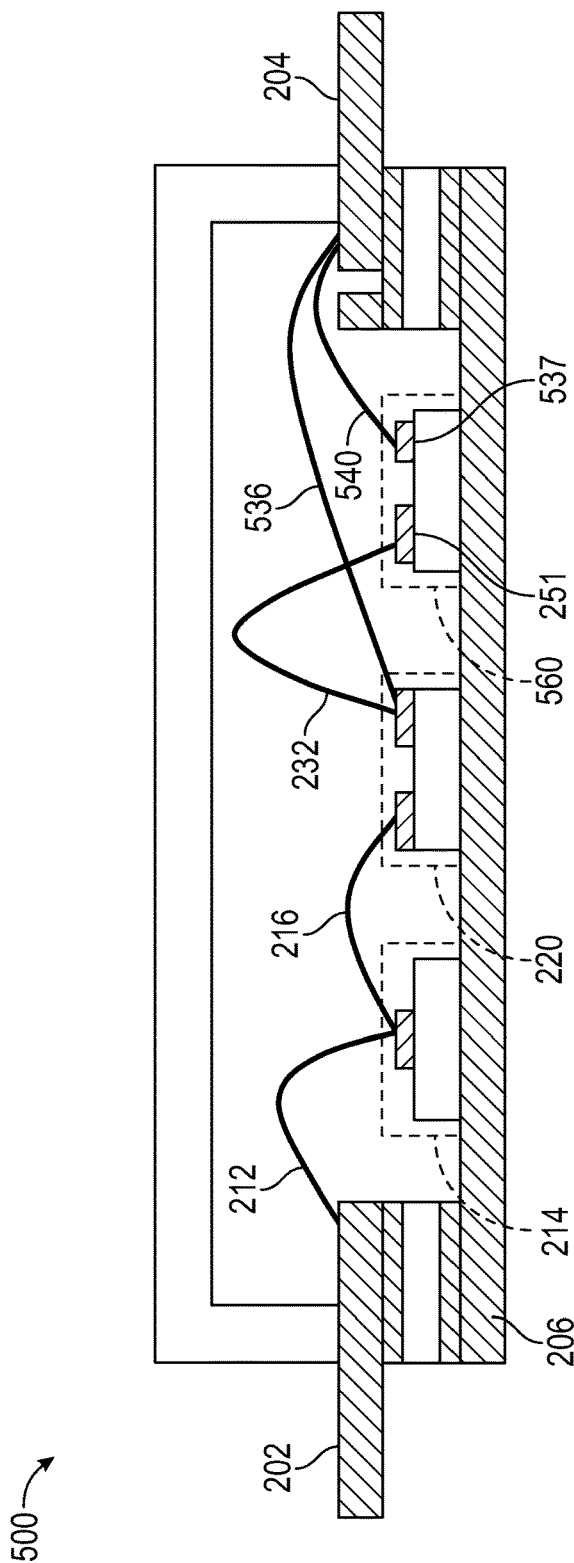
FIG. 6 is a cross-sectional, side view of the RF amplifier device of FIG. 5 along line 6-6.

FIG. 5 is a top view of an example of a packaged RF amplifier device 500 that embodies the circuit of FIG. 4, in accordance with an example embodiment. More particularly, the interconnected electrical components and elements of device 500 may be modeled by the schematic diagram of FIG. 4. For enhanced understanding, FIG. 5 should be viewed in parallel with FIG. 6, which is a cross-sectional, side view of the RF amplifier device 500 of FIG. 5 along line 6-6. Except for the replacement of low-pass matching circuit 135 with low-pass matching circuit 435, and the inclusion of inductive element 436 (e.g., inductive element 536, FIG. 5), packaged RF amplifier device 500 may be substantially similar to the device 200 of FIGS. 2 and 3, and like reference numbers are used in both drawings to indicate elements that may be substantially the same between the two embodiments.

In the device 500 of FIG. 5, each output impedance matching circuit 530 includes three inductive elements 232, 536, 540 (e.g., $L_{shunt}$ 132, $L_{series}$ 436, and $L_{BB}$ 440, FIG. 4) and two capacitors (e.g., $C_{shunt}$ 134 and $C_{BB}$ 438, FIG. 4), where the capacitors form portions of device 560 (e.g., device 460, FIG. 4), in an embodiment. Again, each inductive element 232, 536, 540 is formed from a plurality of parallel, closely-spaced sets of bondwires. For example, shunt inductive element 232 (e.g., $L_{shunt}$ 132, FIG. 4) includes a plurality of bondwires coupled between the first current conducting terminal (e.g., the drain) of transistor 220 and a first bond pad 251 (e.g., corresponding to RF cold point node 151, FIG. 4) on a top surface of the device 560. The first bond pad 251 is electrically coupled to a shunt capacitor (e.g., $C_{shunt}$ 134, FIG. 4) within the device 560. A series inductive element 536 (e.g., $L_{series}$ 436, FIG. 4) includes a plurality of bondwires coupled between the first current conducting terminal of transistor 220 and the output lead 204. A bond back inductive element 540 (e.g., $L_{BB}$ 440, FIG. 4) is coupled between the output lead 204 and a second bond pad 537 (e.g., corresponding to node 437, FIG. 4) on the top surface of the device 560. The second bond pad 537 is electrically coupled to a bond back capacitor (e.g., $C_{BB}$ 438, FIG. 4) within the device 560. Second terminals of the shunt and bond back capacitors within the device 560 are coupled to the flange 206 (e.g., to ground).

As will now be further discussed, the exemplary RF shielding structures help enhance drain efficiency in packaged transistors by reducing eddy currents, controlling the current return path of RF signals, and decreasing losses from bond pads. Referring initially to the side-view representation of a portion of an unshielded RF amplifier packaged device 700 in FIG. 7, a semiconductor (e.g., silicon) integrated passive device (IPD) 701 includes a semiconductor substrate 702 (e.g., a silicon or other semiconductor substrate), a high-density capacitor 756, a first RF (shunt) capacitor 734, and a second RF capacitor 738. In the equivalent circuit shown in FIG. 1, the high-density capacitor 756 corresponds with envelope capacitor 156, first and second RF capacitors 734 and 738 correspond with capacitors 134 and 138, active die 720 corresponds with transistor 120, bondwires 732, 736, and 740 correspond with inductive elements 132, 136, and 140, respectively, and flange 706 corresponds with ground node 157 or flange 206.

In one embodiment, the IPD 701 may comprise a portion of a wafer formed from a bulk semiconductor material, e.g., silicon or another suitable semiconductor material with overlying conductive and dielectric layers. The IPD may be formed using a variety of semiconductor processes, including layering dielectric and conductive materials, and patterning the dielectric and conductive material layers, among other processes. In the material layering process, dielectric and conductive materials can be grown or deposited on the wafer substrate by techniques involving thermal oxidation, nitridation, chemical vapor deposition, evaporation, and sputtering. Photolithography involves the masking of areas of the surface and etching away undesired material to form specific structures.

Generally, the IPD 701 may be fabricated from a number of layers of different materials, including insulators, and conductors that are each patterned to form particular structures within the IPD 701. Such structures may include capacitors, inductors, resistors, transmission lines, and conductive vias that electrically connected different material layers within the IPD 701.

After the IPD 701 is formed, the wafer may be singulated to separate the IPD 701 from other devices that may be formed in the wafer. The IPD 701 can then be connected to other components within an amplifier system.

The IPD 701 is situated on a flange 706 (e.g., flange 206, FIGS. 2, 3), and on opposing sides of IPD 701 are the active die 720 (e.g., die 220, FIGS. 2, 3) and portions of the transistor package, such as a portion of the insulator frame 708 (e.g., insulator frame 208, FIGS. 2, 3) and an output terminal 704 (e.g., terminal 104 or lead 204, FIGS. 1-3). A terminal of the active die 720 (e.g., a current conducting terminal, such a drain terminal) is connected to a first terminal 733 of the first RF capacitor 734 via a first plurality of bondwires 732, and to a first terminal 737 of the second RF capacitor 738 via a second plurality of bondwires 736. The first terminal 733 of the first RF capacitor 734 also is connected, through resistor 752 (e.g., resistor 152, FIG. 1) and inductor 754 (e.g., inductor 154, FIG. 1) to a first terminal 755 of capacitor 756. Second terminals 735, 739, and 757 of the first RF capacitor 734, the second RF capacitor 738, and the high-density capacitor 756 are connected to the flange 706 (e.g., corresponding to node 157, FIG. 1, and flange 206, FIGS. 2, 3). The first terminal 737 of the second RF capacitor 738 is connected to the output terminal 704 (e.g., terminal 104 or lead 204, FIGS. 1-3) via a third plurality of bondwires 740. It is noted that bondwires 732, 736, and 740 correspond with the three inductive elements 132, 136, 140 of FIG. 1, respectively, and with bondwires 232, 236, 240, FIGS. 2, 3, respectively.

An electric field in the device 700 is represented by electric field lines 730 extending from the flange 706 to the bondwires 736 and 740. A "forward" current $I_{fwd}$ 742 travels from active die 720 along bondwires 736 and 740 and to the output terminal 704. A reverse current $I_{rev}$ 744 travels from the output side of the transistor package (e.g., from the portion of insulator frame 708 under output terminal 704) to active die 720 primarily along the flange 706. During operation, the reverse current 744 travels along the surface of the substrate to which IPD 701 is attached (e.g., flange 706, FIG. 7). The eddy currents develop between the reverse current path 744 and the forward current path 742, and those eddy currents can sometimes impinge upon the material from which high-density capacitor 756 is formed. The material from which high-density capacitor 756 may be a relatively-lossy material, and thus those eddy currents may induce significant losses through the material. In other words, during operation, significant loss may occur through the lossy material of high-density capacitor 756, which is positioned between reverse current path 744 and the forward current path 742.

There are at least two types of loss that may be reduced through implementation of the various embodiments. The first type of loss occurs through the lossy material positioned between the forward current 742 and reverse current 744 paths, as discussed above. The second type of loss occurs through additional, relatively lossy material that is positioned very close to the bond pads 737 (e.g., positioned such that the distance ("b") between the lossy material and the bond pad is less than five times the width of bond pad "a"). When current flows along the surface of the bond pad 737 (e.g., between ends of bondwires 736 and 740 that are coupled to the bond pad), the bond pad 737 may behave like a microstrip transmission line. If the lossy material (e.g., a high density capacitor 756) is positioned very physically close to the bond pad 737, the lossy material near the bond pad can decrease the quality factor of the bond pad, potentially leading to significant losses through the lossy material.

It is noted that, according to an embodiment of the IPD, a shielding structure is placed between the material from which the IPD's high-density capacitor is formed and the bond pads of the IPD's RF capacitors, which may allow the high-density capacitor to be positioned closer to bond pads, without incurring the losses that may otherwise be experienced without the shielding structure.

It is also noted that, to achieve a relatively high quality factor for the bond pads of the IPD's second RF capacitor (which may behave as a microstrip transmission line), the dielectric layer of the IPD's second RF capacitor may preferably have a low loss tangent. This can improve the quality factor of the bond pads and may further reduce losses.

It is moreover noted that, in certain devices, both types of losses are caused by eddy currents in the high density capacitor. However, the first type of loss generally results when the lossy material of the high density capacitor is positioned between reverse current path 744 and the forward current path 742, while the second type of loss generally results when the lossy material of the high density capacitor is positioned very close to bond pad 737, which can behave like a microstrip transmission line.

As discussed above, for conventional devices, RF performance may degrade when using integrated structures like high-density capacitor 756 with semiconductor-based technology because of potential eddy currents being generate within the material of high density capacitor 756. Further, losses from bond pads could reduce drain efficiency in packaged transistors.

According to various embodiments, a modified path for the return current, which may function as a shielding structure, addresses the performance degradation mentioned above. Referring to the side-view representation of an example shielded device 800 in FIG. 8, a shielded semiconductor (e.g., silicon) IPD 801 includes a high-density capacitor 856, a first RF (shunt) capacitor 834, and a second RF capacitor 838. In the circuit shown in FIG. 1, the high-density capacitor 856 corresponds with envelope capacitor 156, and first and second RF capacitors 834 and 838 correspond with capacitors 134 and 138.

The IPD 801 is situated on a flange 806 (e.g., corresponding to flange 206, FIGS. 2, 3), and on opposing sides of IPD 801 are the active die 820 (e.g., die 220, FIGS. 2, 3) and portions of the transistor package, such as a portion of the insulator frame 808 (e.g., insulator frame 208, FIGS. 2, 3) and an output terminal 804 (e.g., terminal 104 or lead 204, FIGS. 1-3). A terminal of the active die 820 (e.g., a current conducting terminal, such as a drain terminal) is connected to a first terminal 833 of the first RF capacitor 834 via a first plurality of bondwires 832, and to a first terminal 837 of the second RF capacitor 838 via a second plurality of bondwires 836. The first terminal 833 of the first RF capacitor 834 also is connected, through resistor 852 (e.g., resistor 152, FIG. 1) and inductor 854 (e.g., inductor 154, FIG. 1) to a first terminal 855 of capacitor 856. Second terminals (not numbered or shown in FIG. 8) of the first RF capacitor 834 and the second RF capacitor 838 are connected to the flange 806 (e.g., corresponding to node 157, FIG. 1, and flange 206, FIGS. 2, 3). Similarly, the second terminal 857 of the high-density capacitor 856 is connected to the flange 806. The first terminal 837 of the second RF capacitor 838 is connected to the output terminal 804 (e.g., terminal 104 or lead 204, FIGS. 1-3) via a third plurality of bondwires 840. It is noted that bondwires 832, 836, and 840 correspond with the three inductive elements 132, 136, 140 of FIG. 1, respectively, and with bondwires 232, 236, 240, FIGS. 2, 3, respectively.

The shielding structure 848 includes a continuous conductive path, which includes a first vertical portion 849, an elevated horizontal portion 850, and a second vertical portion 851. Ends of the first and second vertical portions 849, 851 of the shielding structure 848 that are proximate to the bottom surface of the IPD 801 are electrically coupled to the flange 806, in an embodiment. The elevated horizontal portion 850 is located above the high-density capacitor 856, in an embodiment. Note that in FIG. 8, the view depicted shows elevated horizontal portion 850 as two different segments (allowing for the vertical interconnect extending from inductor 854 to high density capacitor 856), but both segments 850 are electrically connected to one another forming a single conductor structure 850 that extends at least from first vertical portion 849 to second vertical portion 851. Accordingly, the materials from which the high-density capacitor 856 is formed are located between the top surface of the flange 806 and the horizontal portion 850 of the shielding structure 848. An electric field is represented by electric field lines 830 extending from a first portion of the flange 806 (between active die 820 and the left vertical portion 851 of shielding 848), from the horizontal portion 850 of the shielding structure 848, and from a second portion of the flange (between the right vertical portion 849 of shielding 848 and the insulator frame 808) to the bondwires 836 and 840.

During operation, a "forward" current $I_{fwd}$ 842 travels from the output terminal (e.g., drain terminal) of active die 820 along bondwires 836 and 840 and to the output terminal 804. A "return" current $I_{rev}$ 844 travels across the flange 806 from the insulator frame 808, and when it reaches the portion of the flange 806 that is electrically connected to the reverse conductive path structure 848 of the IPD 801 (or more specifically to vertical portion 849), significant portions of the reverse current 844 travel from the flange 806 at the right side of the IPD 801 into and through the reverse conductive path structure 848 to the flange 806 at the left side of the IPD 801, rather than traveling along the portion of the surface of the flange 806 to which IPD 801 is attached (e.g., the portion of flange 806 underlying the reverse conductive path structure 848 and between the vertical portions 849, 851 of the reverse conductive path structure 848). Although eddy currents still may develop between the reverse current path 844 and the forward current path 842, those eddy currents are above the material from which the high-density capacitor 856 is formed, and thus the eddy currents would not significantly impinge upon the relatively lossy material of the high-density capacitor 856. Accordingly, those eddy currents may not induce significant losses through the high-density capacitor 856. In other words, the reverse current path structure 848 substantially reduces or eliminates the presence of relatively lossy material for the high-density capacitor 856 between the device's forward path 842 and the portion of the return current path 844 that is carried by the reverse current path structure 848.

Figure 9A:
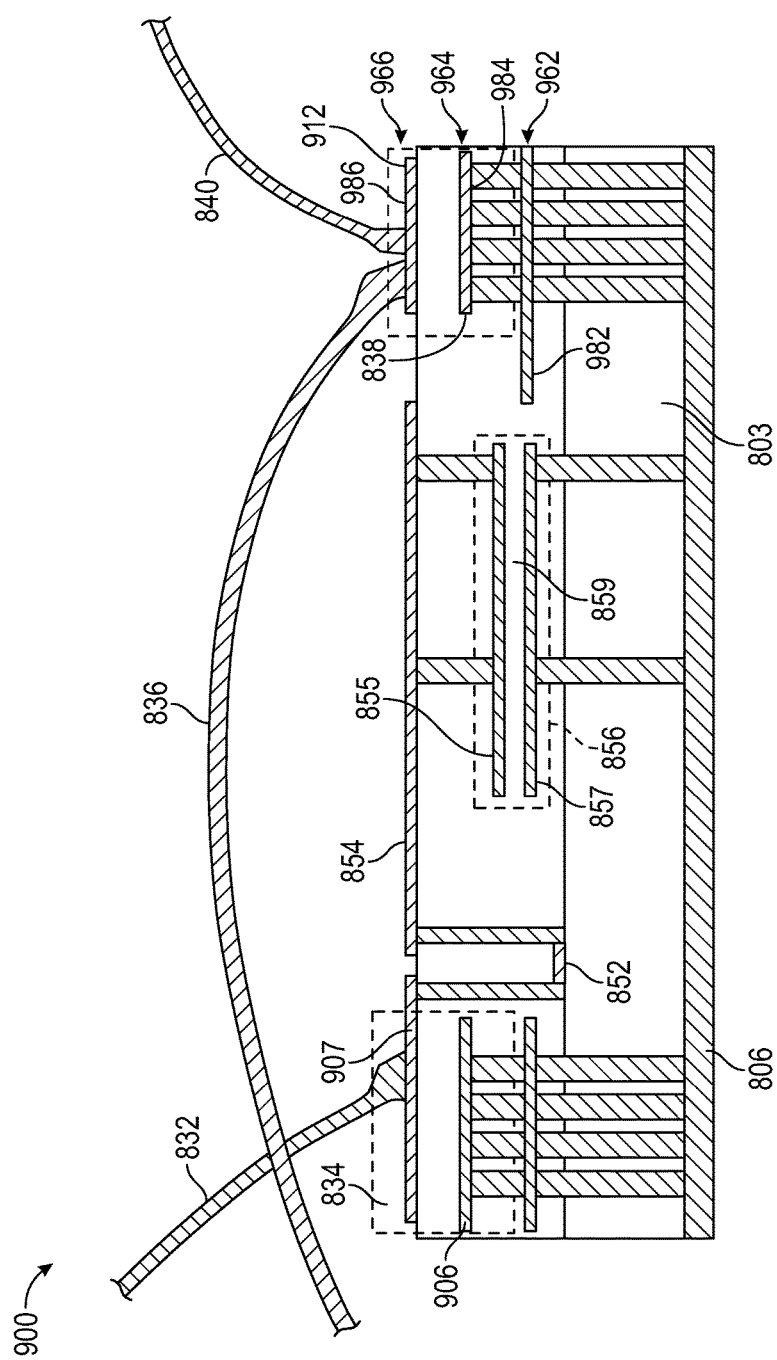
FIG. 9A is a cross-sectional, more-detailed side view, along line 9A-9A shown in FIG. 10, of an RF amplifier device with a shielded IPD that includes a high-density capacitor, showing metal layers and through-silicon vias (TSVs), in accordance with one or more example embodiments.
Figure 9B:
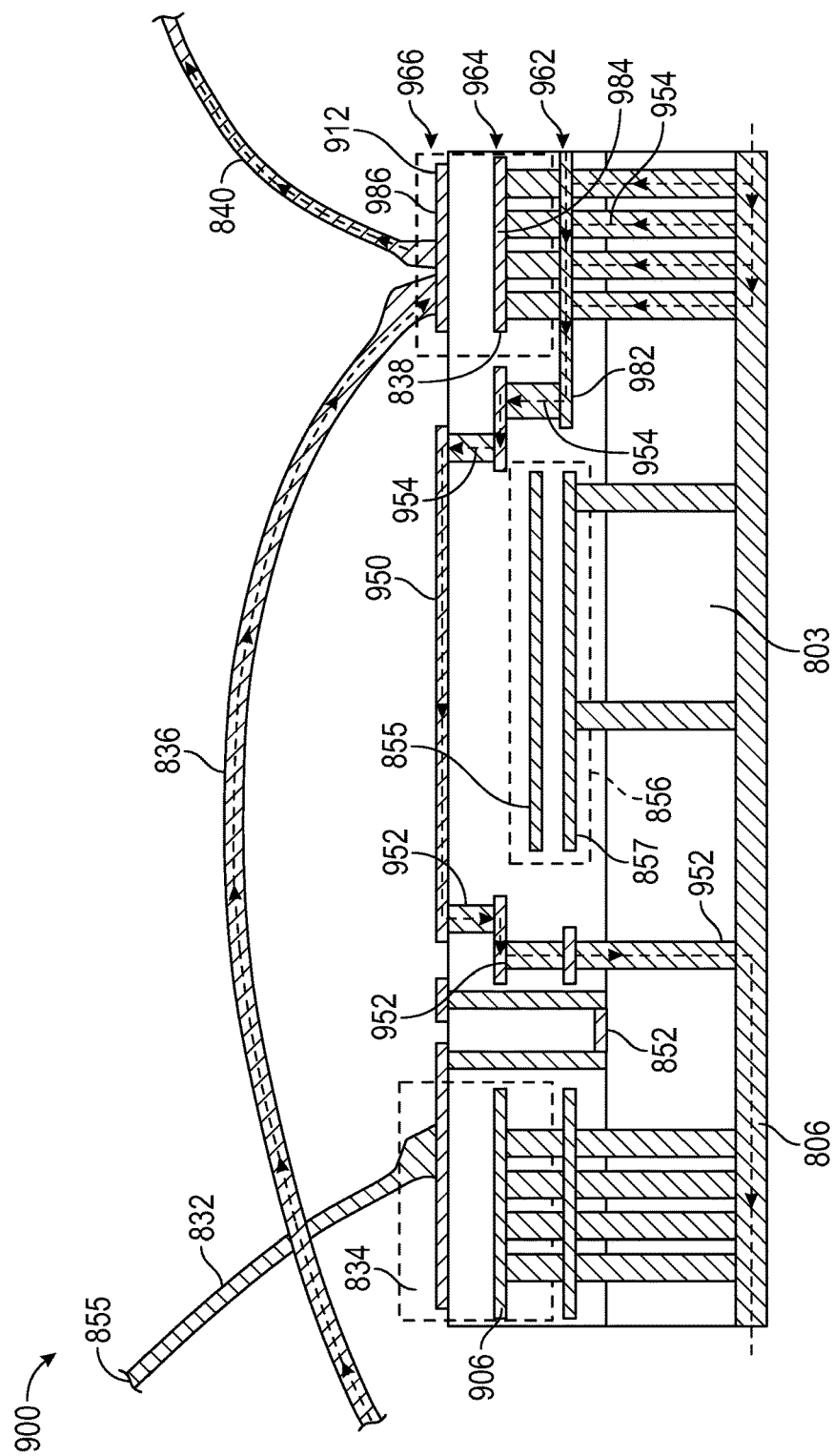
FIG. 9B is a cross-sectional, more-detailed side view, along line 9B-9B shown in FIG. 10, of an RF amplifier device with a shielded IPD that includes a high-density capacitor, showing metal layers, TSVs, and forward and reverse current paths, in accordance with one or more example embodiments.

An exemplary implementation of shielded device 800 is depicted by device 900 in FIGS. 9A and 9B. FIGS. 9A and 9B of device 900 are each cross-sectional views of device 900 taken through different portions of device 900. Device 900 includes a conductive layer 906 (e.g., which may be coupled to a flange 806) deposited on a surface of a semiconductor substrate 803 (e.g., a silicon or other semiconductor substrate), and a plurality of conductive and dielectric layers formed on or over the top surface of the semiconductor substrate 803. A first conductive layer 982 at relative Z-height 962, a second conductive layer 984 at Z-height 964 relative to conductive layer 906, and a third conductive layer 986 at Z-height 966 relative to conductive layer 986. Z-heights can vary greatly depending on the application, but example Z-heights, for certain implementations, may be, for example, 74 microns (µm) for Z-height 962, 77 µm for Z-height 964, and 81 µm for Z-height 966. It is also noted that "disposed" is intended to identify relative position, and does not signify "placement" of the layer during a manufacturing process, or require direct contact between the layers disposed on top of each other (i.e., there could be additional layers or structures in between one layer disposed on another layer). In one or more embodiments, the conductive layers may be deposited and patterned to have different structures and shapes by etching. It is noted that device 900 includes other layers not illustrated in FIGS. 9A and 9B, and that the representations in FIGS. 9A and 9B are not to scale.

Device 900 includes first and second RF capacitors 834, 838, and high-density capacitor 856. In certain embodiments, the high-density capacitor 856 may include terminals 855, 857 (or electrodes) patterned into the first and third conductive layers 982, 986, and the terminals may be separated by a portion of a dielectric layer 859, although capacitor 856 may be implemented in other ways (e.g., using other conductive layers). In a more specific example embodiment, capacitor 856 may be a MIM (metal-insulator-metal) capacitor that is integrally formed as a portion of the device 900. The capacitor 856 may be formed entirely above the semiconductor substrate 803, or may have portions that extend into the semiconductor substrate 803 or are otherwise coupled to, or in contact with, semiconductor substrate 803. According to an embodiment, the capacitor 856 may be formed from a first electrode 855, a second electrode 857, and a dielectric material 859 between the first and third electrodes. The dielectric material 859 of capacitor 856 may include one or more layers of polysilicon, various oxides, a nitride, or other suitable materials.

Figure 8:
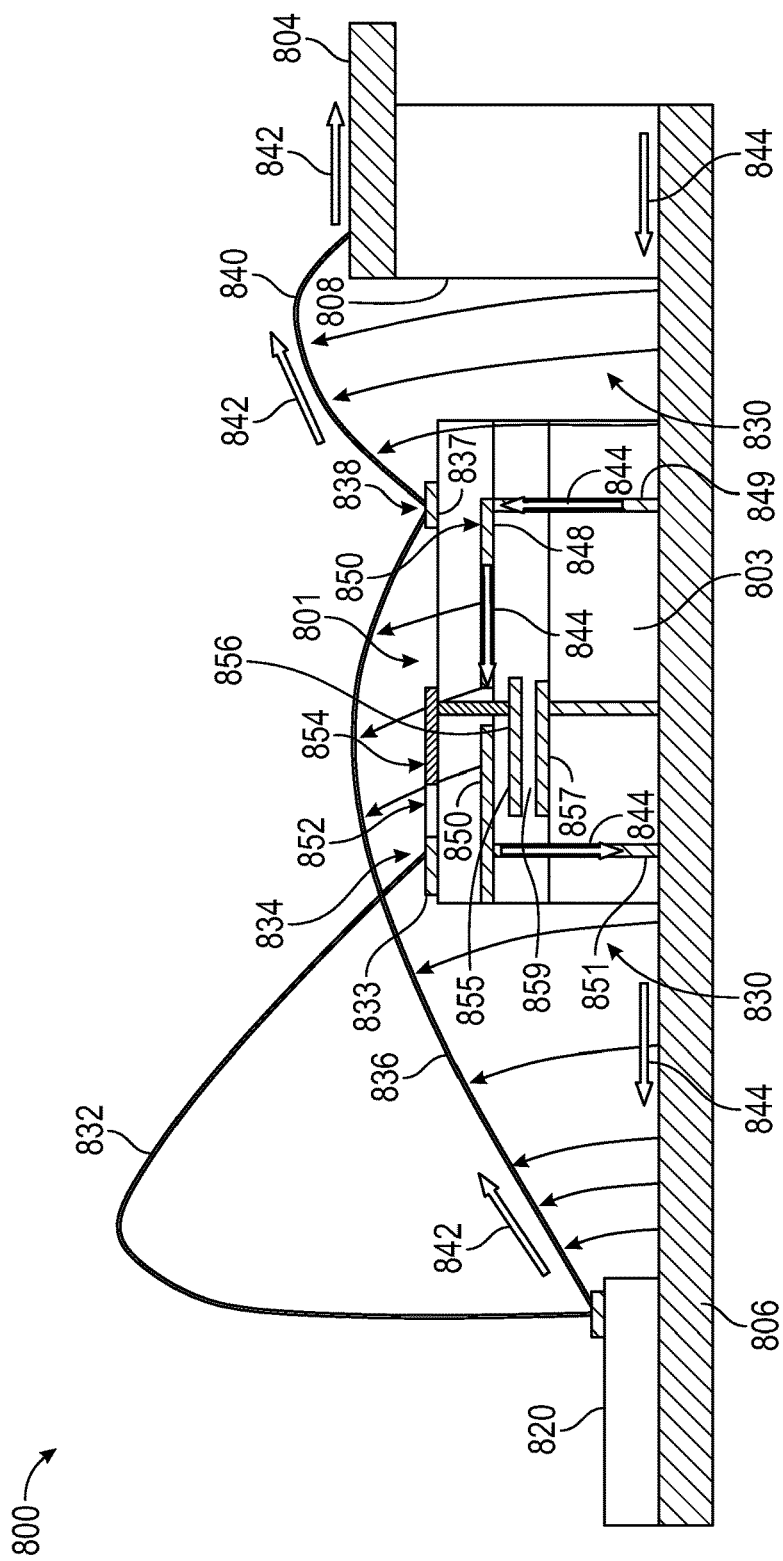
FIG. 8 is a cross-sectional, simplified side view of an RF amplifier device with a shielded IPD that includes a high-density capacitor, showing forward and reverse current paths, in accordance with one or more example embodiments.

In various embodiments, the first and second electrodes 855, 857 may include horizontal portions of conductive layers (e.g., portions that are parallel to portion 950) and/or vertical portions (e.g., portions that are orthogonal to portion 950) of conductive layers that are interconnected. Further, the first and second electrodes 855, 857 may be formed from metal layers and/or from conductive semiconductor materials (e.g., polysilicon). Although particular two-plate capacitor structures are shown in FIGS. 8-9, a variety of other capacitor structures alternatively may be utilized, as would be understood by one of skill in the art based on the description herein.

The third metal layer 986 includes a first portion 907, which may form a first terminal (or electrode) of RF capacitor 834, and a second portion 912, which may form a first terminal (or electrode) of RF capacitor 838. In other embodiments, the first terminals of capacitors 834, 838 may be formed from different conductive layers. A portion 950 of a conductive layer (e.g., the third conductive layer 986) is disposed over high-density capacitor 856 to elevate the return current path over the high-density capacitor 856. Although the first, second, and third conductive features 907, 912, and 950 are depicted as being formed from portions of the third conductive layer 986, and thus are depicted at the same height (i.e., height 966), they are not continuous, but rather separate segments of the third conductive layer 986. In other embodiments, conductive features 907, 912, and 950 may be formed from portions of different conductive layers.

As best seen in the cross-section of FIG. 9B, one or more through-silicon vias (TSVs) 952, 954, extend from the bottom surface of IPD 801 (and thus from flange 806) to the horizontal shielding portion 950 of the third conductive layer 986. The reverse current $I_{rev}$ 844 is provided with a conductive current path 848 (see arrows 954 in FIG. 9B) over the high-density capacitor 856 via the TSVs 952, 954 and shielding portion 950. Referring also to FIG. 8, TSVs 954 correspond to the first vertical portion 849, a patterned portion of layer 966 corresponds to an elevated horizontal portion 850, and the second vertical portion 851 corresponds to TSVs 952.

Figure 10:
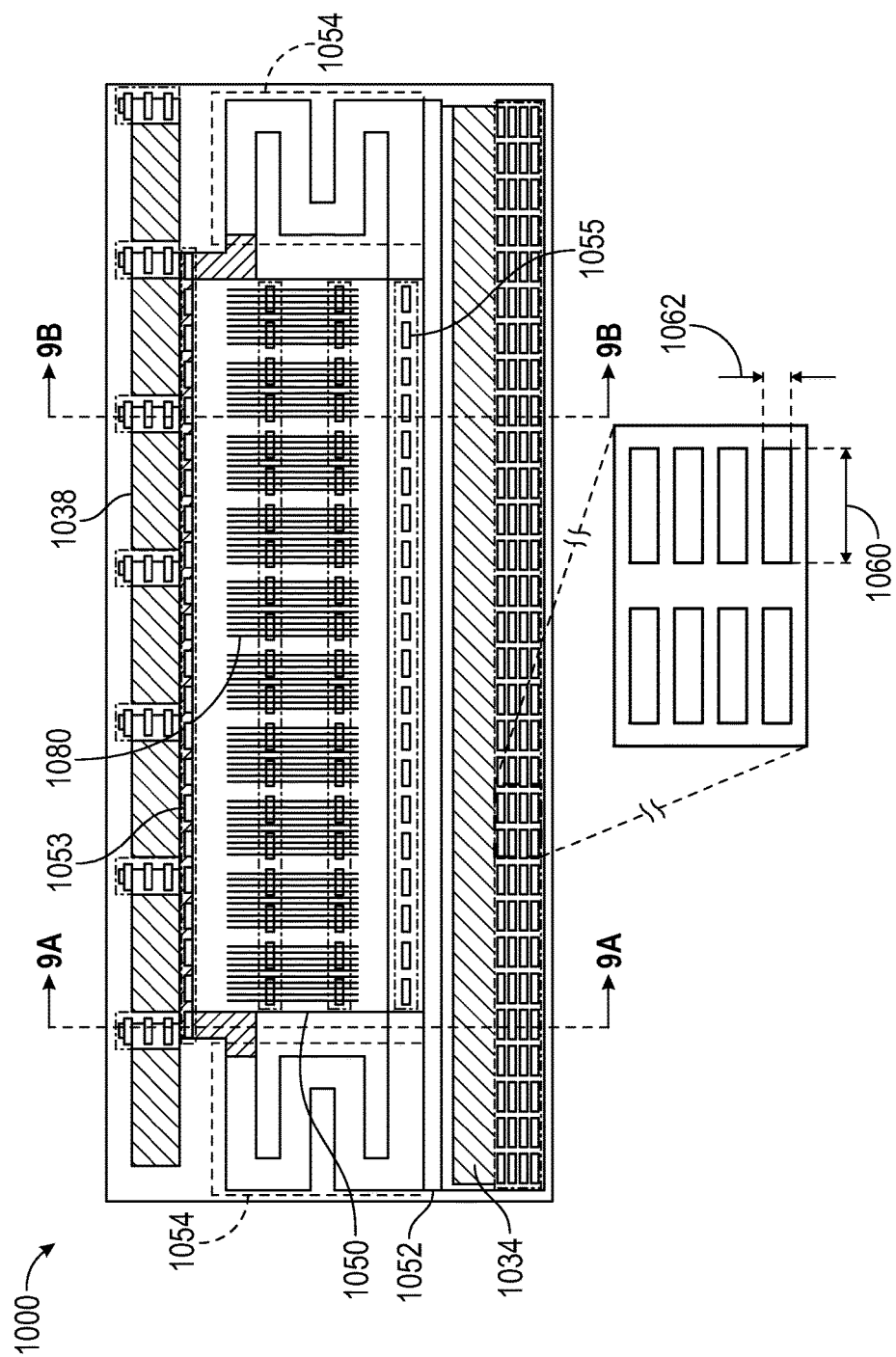
FIG. 10 is a top view of an example shielded IPD of a packaged RF amplifier device, such as the one depicted in FIGS. 9A and 9B, in accordance with one or more example embodiments.

FIG. 10 depicts a top view of a shielded IPD 1000 that can be used to implement the approach represented in FIGS. 9A and 9B. The shielded IPD 1000 includes first RF capacitor 1034 (e.g., capacitor 134, 834, FIGS. 1, 9B), a plurality of parallel-coupled second RF capacitors 1038 (e.g., capacitor 138, 838, FIGS. 1, 9B), a resistor 1052 (e.g., resistor 152, 852, FIGS. 1, 9B), parallel inductors 1054 (e.g., inductor 154, 854, FIGS. 1, 9A), and a buried high-density capacitor (e.g., capacitor 156, 856, FIGS. 1, 9B), which is not visible in the top view of FIG. 10. The various components are interconnected as previously described.

Near the center is shielding structure 1050, which may be formed at least in part by, for example, the shielding portion 950 of third conductive layer 986. It is noted that the horizontal portion of the shielding structure 1050 needs not be limited to only the third conductive layer 986, and may alternatively or additionally include portions of other layers, such as the second conductive layer 984, or other conductive layers. Further, an embodiment of a device may include more than three conductive layers, and the horizontal portion of the shielding structure 1050 may be formed from various portions of those layers.

The high-density capacitor within the IPD 1000 is not viewable from the top (in the top view of FIG. 10) because it is positioned underneath the horizontal portion of shielding structure 1050. On opposing sides of the shielding structure 1050 are RF capacitor 1034 (corresponding with capacitor 134 in FIG. 1 or 834 in FIG. 9B), and RF capacitor 1038 (corresponding with capacitor 138 in FIG. 1 or 838 in FIG. 9B). An inductive element 1054 (corresponding with inductance 154 in FIG. 1 or 854 in FIG. 9A), and a resistor 1052 (corresponding with resistor 152 in FIG. 1 or 852 in FIG. 9B), are also depicted in this top-view perspective. In actuality, some or all of these components may be buried under overlying layers.

The shielding structure 1050 may include a plurality of slots (voids) 1080 that may help to prevent die crack and decrease warpage. The slot size may be, for example, about 2-6 microns (μm) wide (e.g., 5 μm) by about 300-600 μm long (e.g., 545 μm) for IPD arrangements in example implementations. As a rule of thumb in certain implementations, to reduce or prevent coupling, the length and width dimensions of slot 1080 may be, for example, no larger than about one tenth of the wavelength of the low end of operating frequency.

The wavelength of the low end of operating frequency may be represented by:

$$\lambda = v/f \qquad \text{Eq. 1}$$

where v is the phase speed of the wave and f is the low end of operating frequency.

A plurality of conductive vias 1053, 1055, which are depicted as small rectangles in FIG. 10, may make up the vertical portions of the shielding structure (e.g., vertical portions 849, 851, FIG. 8, or TSVs 952, 954, FIG. 9B). As shown, the vertical portions of the shielding structure may include a row of aligned vias 1053, 1055, in some embodiments. For example, as shown in the enlarged portion of the device, each via may have a length 1060 in a range of about 1 μm to about 50 μm, and a width 1062 in a range of about 1 μm to about 50 μm. In other embodiments, the vias 1053, 1055 may be circular, oval, or may have some other cross-sectional shape.

It is noted that although particular configurations of vias are shown in FIGS. 9A, 9B, and 10, the vias may be arranged in different manners, in other embodiments. Having multiple vias in parallel can reduce the impedance of the vias to enable the device to operate more efficiently. It is noted that some of the vias may be interconnected while others may be isolated. Also, vias may extend up to different layers (e.g., the second conductive layer 984 or the third conductive layer 986, depicted in FIGS. 9A and 9B). The number and configuration of vias may be driven at least in part by the internal circuitry in a package, and other interconnections and configurations may be utilized to suit different applications in other embodiments.

Low-frequency probe testing for baseband (without DC bias on the gate and drain) has shown that the LFR is over 850 MHz using a high-density capacitor, as compared with LFRs of about 85 MHz in designs without a baseband termination circuit. The shielding structure is not expected to deteriorate baseband performance. The embodiments discussed above are well-suited for many RF power products, including but not limited to those that require ISBWs greater than 200 MHz with reduced power dissipation (that may result from electromagnetic coupling) and high RF efficiency. The disclosed approach helps enable multiband transistors in discrete, integrated circuit (IC), or module format. Products can be, for example, in air cavity or over-molded packages, and may be single-stage or multi-stage products. Example implementations can be directly incorporated into, for example, transistor products based on silicon (Si), gallium arsenide (GaAs), and/or gallium nitride (GaN).

In an embodiment, an IPD includes a semiconductor substrate and a MIM capacitor coupled to the semiconductor substrate. The MIM capacitor includes a first electrode, a second electrode, and a dielectric between the first electrode and the second electrode. The IPD includes a first RF capacitor over the semiconductor substrate, a second RF capacitor over the semiconductor substrate, and a metal layer patterned to form a portion of an elevated metal shielding structure. The elevated metal shielding structure is over the MIM capacitor.

In an embodiment, an RF amplifier device includes a ground flange, a semiconductor die on the ground flange and an IPD on the ground flange. The IPD includes a semiconductor substrate, a MIM capacitor coupled to the semiconductor substrate, a first RF capacitor over the semiconductor substrate, a second RF capacitor over the semiconductor substrate, and a metal layer patterned to form a portion of an elevated metal shielding structure. The elevated metal shielding structure is over the MIM capacitor. The IPD is electrically coupled to the semiconductor die.

In an embodiment, an RF amplifier device includes a ground flange, a semiconductor die on the ground flange, and an IPD on the ground flange. The IPD includes a semiconductor substrate and a MIM capacitor coupled to the semiconductor substrate. The MIM capacitor includes a first electrode, a second electrode, and a dielectric between the first electrode and the second electrode. The RF amplifier device includes a first RF capacitor over the semiconductor substrate, a second RF capacitor over the semiconductor substrate, and a metal layer patterned to form a portion of an elevated metal shielding structure, a first plate of the first RF capacitor and a first plate of the second RF capacitor. The elevated metal shielding structure is over the MIM capacitor. The IPD is electrically coupled to the semiconductor die. At least one of the first electrode and the second electrode of the MIM capacitor includes a first portion that is parallel to the elevated metal shielding structure and a second portion that is orthogonal to the elevated metal shielding structure.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated passive device (IPD), comprising:
   a semiconductor substrate;
   a metal-insulator-metal (MIM) capacitor coupled to the semiconductor substrate, the MIM capacitor including:
      a first electrode,
      a second electrode, and
      a dielectric between the first electrode and the second electrode;
   a first radio frequency (RF) capacitor over the semiconductor substrate;
   a second RF capacitor over the semiconductor substrate; and
   a metal layer patterned to form a portion of an elevated metal shielding structure, the elevated metal shielding structure being over the MIM capacitor and wherein at least one of the first electrode and the second electrode of the MIM capacitor includes a first portion that is parallel to the elevated metal shielding structure and a second portion that is orthogonal to the elevated metal shielding structure.

2. The IPD of claim 1, wherein at least one of the first electrode and the second electrode of the MIM capacitor includes a first portion that is parallel to the elevated metal shielding structure and a second portion that is orthogonal to the elevated metal shielding structure.

3. The IPD of claim 1, further comprising a via through the semiconductor substrate, wherein the via is electrically coupled to the elevated metal shielding structure.

4. The IPD of claim 1, wherein at least one of the first electrode and the second electrode of the MIM capacitor includes a conductive semiconductor material.

5. The IPD of claim 1, wherein the metal layer is patterned to form a first plate of the first RF capacitor and a first plate of the second RF capacitor.

6. The IPD of claim 1, further including a set of slots formed in the elevated metal shielding structure, each slot having a width ranging from 0.1 μm to 10000 μm, and a length ranging from 0.1 μm to 10000 μm.

7. The IPD of claim 1, wherein the dielectric includes one or more layers of a polysilicon material, an oxide material, or a nitride material.

8. A radio frequency (RF) amplifier device, comprising:
   a ground flange;
   a semiconductor die on the ground flange; and
   an integrated passive device (IPD) on the ground flange, the IPD including:
      a semiconductor substrate;
      a metal-insulator-metal (MIM) capacitor coupled to the semiconductor substrate;
      a first RF capacitor over the semiconductor substrate;
      a second RF capacitor over the semiconductor substrate; and
      a metal layer patterned to form a portion of an elevated metal shielding structure, the elevated metal shielding structure being over the MIM capacitor, wherein the IPD is electrically coupled to the semiconductor die and wherein at least one of the first electrode and the second electrode of the MIM capacitor includes a first portion that is parallel to the elevated metal shielding structure and a second portion that is orthogonal to the elevated metal shielding structure.

9. The RF amplifier device of claim 8, wherein the MIM capacitor is part of an envelope frequency termination circuit of the RF amplifier device.

10. The RF amplifier device of claim 8, wherein the first RF capacitor and the second RF capacitor are part of an output impedance matching circuit of the RF amplifier device.

11. The RF amplifier device of claim 8, wherein the MIM capacitor includes a first electrode, a second electrode, and a dielectric between the first electrode and the second electrode and at least one of the first electrode and the second electrode of the MIM capacitor includes a first portion that is parallel to the elevated metal shielding structure and a second portion that is orthogonal to the elevated metal shielding structure.

12. The RF amplifier device of claim 8, further comprising a via through the semiconductor substrate, wherein the via is electrically coupled to the elevated metal shielding structure.

13. The RF amplifier device of claim 8, wherein the MIM capacitor includes a first electrode, a second electrode, and a dielectric between the first electrode and the second electrode and at least one of the first electrode and the second electrode of the MIM capacitor includes a conductive semiconductor material.

14. The RF amplifier device of claim 13, wherein the dielectric includes one or more layers of a polysilicon material, an oxide material, or a nitride material.

15. The RF amplifier device of claim 8, wherein the metal layer is patterned to form a first plate of the first RF capacitor and a first plate of the second RF capacitor.

16. The RF amplifier device of claim 8, further including a set of slots formed in the elevated metal shielding structure, each slot having a width ranging from 0.1 µm to 10000 µm, and a length ranging from 0.1 µm to 10000 µm.

17. A radio frequency (RF) amplifier device, comprising:
a ground flange;
a semiconductor die on the ground flange; and
an integrated passive device (IPD) on the ground flange, the IPD including:
a semiconductor substrate;
a metal-insulator-metal (MIM) capacitor coupled to the semiconductor substrate, the MIM capacitor including:
a first electrode,
a second electrode, and
a dielectric between the first electrode and the second electrode;
a first RF capacitor over the semiconductor substrate;
a second RF capacitor over the semiconductor substrate; and
a metal layer patterned to form a portion of an elevated metal shielding structure, a first plate of the first RF capacitor and a first plate of the second RF capacitor, the elevated metal shielding structure being over the MIM capacitor, wherein the IPD is electrically coupled to the semiconductor die, wherein at least one of the first electrode and the second electrode of the MIM capacitor includes a first portion that is parallel to the elevated metal shielding structure and a second portion that is orthogonal to the elevated metal shielding structure.

18. The RF amplifier device of claim 17, wherein the first RF capacitor and the second RF capacitor are part of an output impedance matching circuit of the RF amplifier device.

19. The RF amplifier device of claim 17, wherein at least one of the first electrode and the second electrode of the MIM capacitor includes a conductive semiconductor material.

20. The RF amplifier device of claim 17, wherein the dielectric includes one or more layers of a polysilicon material, an oxide material, or a nitride material.

* * * * *